US012787701B2

(12) United States Patent
Orenbuch et al.

(10) Patent No.: US 12,787,701 B2
(45) Date of Patent: Nov. 3, 2026

(54) SUBSTRATE PRE-ALIGNER

(71) Applicant: Applied Materials Israel Ltd., Rehovot (IL)

(72) Inventors: Itamar Orenbuch, Rehovot (IL); Avi Aboodi, Rehovot (IL); Binyamin Bejell, Rehovot (IL)

(73) Assignee: Applied Materials Israel Ltd., Rehovot (IL)

( * ) Notice: Subject to any disclaimer, the term of this patent is extended or adjusted under 35 U.S.C. 154(b) by 275 days.

(21) Appl. No.: 18/241,145

(22) Filed: Aug. 31, 2023

(65) Prior Publication Data

US 2025/0079221 A1 Mar. 6, 2025

(51) Int. Cl.

| | |
|---|---|
| ***H10P 72/50*** | (2026.01) |
| ***G06T 5/80*** | (2024.01) |
| ***G06T 7/00*** | (2017.01) |
| ***G06T 7/13*** | (2017.01) |
| ***G06T 7/73*** | (2017.01) |
| ***H04N 23/56*** | (2023.01) |
| ***H10P 72/00*** | (2026.01) |

(52) U.S. Cl.

CPC ................ *H10P 72/53* (2026.01); *G06T 5/80* (2024.01); *G06T 7/0004* (2013.01); *G06T 7/13* (2017.01); *G06T 7/73* (2017.01); *H04N 23/56* (2023.01); *H10P 72/0606* (2026.01); *G06T 2207/30148* (2013.01)

(58) Field of Classification Search

CPC . H01L 21/68; H01L 21/681; H01L 21/67242; H01L 21/67259; H10P 72/0606; H10P 72/0608; H10P 72/50; H10P 72/53

See application file for complete search history.

(56) References Cited

U.S. PATENT DOCUMENTS

| | | | | |
|---|---|---|---|---|
| 6,538,248 B1 * | 3/2003 | Kametani | H01J 37/28 250/398 |
| 7,295,314 B1 * | 11/2007 | Spady | G01N 21/9501 382/141 |
| 9,786,537 B2 * | 10/2017 | Koelmel | H01L 21/681 |
| 10,041,789 B2 * | 8/2018 | Baggett | H01L 21/681 |
| 2002/0078889 A1 * | 6/2002 | Welch | H01L 21/67259 118/668 |
| 2008/0050006 A1 | 2/2008 | Michael et al. | |
| 2011/0158774 A1 * | 6/2011 | Yamaguchi | H01L 21/67265 414/222.02 |

FOREIGN PATENT DOCUMENTS

WO 2008024476 A2 2/2008

* cited by examiner

*Primary Examiner* — Michael Mccullough
*Assistant Examiner* — Jessica L Burkman
(74) *Attorney, Agent, or Firm* — Kilpatrick Townsend & Stockton LLP

(57) ABSTRACT

A substrate alignment system that includes (i) an illumination unit that is configured to illuminate an illuminated region that comprises an entire edge of a substrate; (ii) a sensing unit having a field of view that covers the entire edge of the substrate even when the substrate is misaligned, the sensing unit includes a sensor that is preceded by a fish eye lens, the sensor is configured to generate detection signals of the entire edge of the substrate; and (iii) a processing circuit that is configured to process the detection signals and determine whether the substrate is misaligned. A determining that the substrate is misaligned triggers an execution of one or more misalignment correction operation for aligning the substrate.

18 Claims, 6 Drawing Sheets

600

600

SUBSTRATE PRE-ALIGNER

BACKGROUND OF THE INVENTION

A substrate may be evaluated by a substrate evaluation system such as a charged particle substrate evaluation system. A charged particle substrate evaluation system is configured to evaluate the substrate by illuminating the substrate by one or more charged particle beams.

Examples of substrate evaluation systems include (i) defect review systems such as a defect review scanning electron microscope SEMVISION™ of APPLIED MATERIALS™ Inc. of San Jose, California, (ii) a metrology system such as the PROVision™ 3E Ebeam™ metrology system of APPLIED MATERIALS™, (iii) an electron beam inspection system such as the PRIMEVISION™ of APPLIED MATERIALS™, or (iv) a critical dimension scanning electron microscope such as the VERITYSEM™ of APPLIED MATERIALS™, and the like. The charge particle evaluation system may manufactured by vendors such as HITACHI™ of Tokyo, Japan, or KLA™ Corporation of Milpitas, California, or may be manufactured by other vendors.

The illuminating the substrate by the one or more charged particle beams requires to position the substrate within a vacuum chamber.

A substrate evaluation system includes a factory interface, a load lock chamber and a target vacuum chamber. The factory interface operates in an atmospheric pressure level, the target vacuum chamber operates at a high vacuum level and the load lock is configured to receive a substrate from the factory interface, undergo a load lock pressure equalization process that causes the load lock chamber to be at the high vacuum level and then provide the substrate to a stage of the target vacuum chamber.

The substrate must be aligned in the target vacuum chamber.

U.S. Patent Application Publication No. 2008/0050006 titled "Method and Apparatus for Semiconductor Wafer Alignment" illustrates a wafer alignment system comprising an image acquisition device, an illumination source, a rotatable wafer platform, and an image processor that includes functionality for mapping coordinates in an image of an article (such as a wafer) on the platform to a "world" frame of reference at each of a plurality of angles of rotation of the platform.

There is a growing need to align the substrate in an accurate and a fast manner.

BRIEF SUMMARY OF THE INVENTION

There is provided a substrate alignment system that includes (i) an illumination unit that is configured to illuminate an illuminated region that comprises an entire edge of a substrate; (ii) a sensing unit having a field of view that covers the entire edge of the substrate even when the substrate is misaligned, the sensing unit includes a sensor that is preceded by a fish eye lens, the sensor is configured to generate detection signals of the entire edge of the substrate; and (iii) a processing circuit that is configured to process the detection signals and determine whether the substrate is misaligned. A determining that the substrate is misaligned triggers an execution of one or more misalignment correction operation for aligning the substrate.

There is provided a method for an alignment of a substrate, the method includes (i) illuminating, by an illumination unit, an illuminated region that comprises an entire edge of the substrate; (ii) generating, by a sensing unit, detection signals of the entire edge of the substrate following the illuminating of the illuminated region; wherein the sensing unit has a field of view that covers the entire edge of the substrate even when the substrate is misaligned, the sensing unit comprises a sensor that is preceded by a fish eye lens; and (iii) processing, by a processing circuit, the detection signals and determining whether the substrate is misaligned; wherein a determining that the substrate is misaligned triggers an execution of one or more misalignment correction operation for aligning the substrate.

There is provided a non-transitory computer readable medium for aligning a substrate, the non-transitory computer readable medium stores instructions that once executed by a substrate alignment system, cause the substrate alignment system to: (i) illuminate, by an illumination unit of the substrate alignment system, an illuminated region that comprises an entire edge of the substrate; (ii) generate, by a sensing unit of the substrate alignment system, detection signals of the entire edge of the substrate following the illuminating of the illuminated region; wherein the sensing unit has a field of view that covers the entire edge of the substrate even when the substrate is misaligned, the sensing unit comprises a sensor that is preceded by a fish eye lens; and (iii) process, by a processing circuit of the substrate alignment system, the detection signals and determining whether the substrate is misaligned; wherein a determining that the substrate is misaligned triggers an execution of one or more misalignment correction operation for aligning the substrate.

BRIEF DESCRIPTION OF THE DRAWINGS

The subject matter regarded as the embodiment is particularly pointed out and distinctly claimed in the concluding portion of the specification. The embodiment, however, both as to organization and method of operation, together with specimens, features, and advantages thereof, may best be understood by reference to the following detailed description when read with the accompanying drawings in which:

Figure 1:
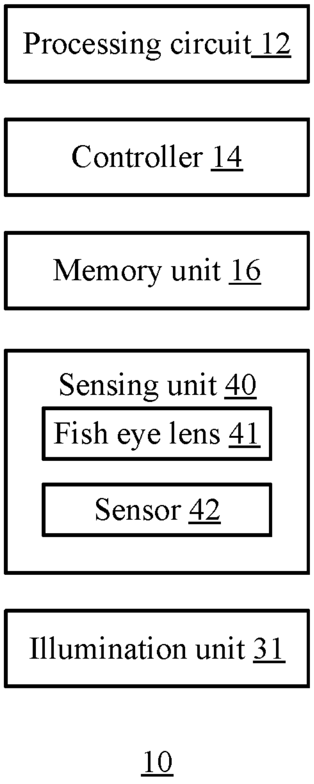
FIG. 1 illustrates an example of a substrate alignment system.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION OF THE INVENTION

There is provided a substrate alignment system that performs an alignment process. According to an embodiment, the alignment is executed while the substrate is located in a load lock chamber, especially when the load lock chamber undergoes a load lock pressure equalization process. The load lock pressure equalization process is time consuming and much longer than the alignment of the substrate, and the execution of the alignment during the load lock pressure equalization process reduces and even eliminates any time penalty associated with the execution of the alignment. The alignment can be executed at a chamber other that the load lock chamber.

The load lock chamber height is relatively small (for example less than 60, 50, 40 centimeter)—and a distance between a sensing unit and the substrate is much smaller (for example less than 60%, 50%, 30%, 20% and the like) than the diameter of the substrate. In order to capture the entire edge of the wafer in one shot, the sensing unit includes a fish eye lens.

In order to determine a misalignment of tens of microns, the substrate alignment system compensates for distortions introduced by the fish eye lens.

The suggested system is highly accurate and does not introduce any significant delay due to the alignment.

The substrate may be a bare wafer, a patterned wafer, a solar panel, and the like.

FIG. 1 illustrates an example of a substrate alignment system 10 that includes:

a. An illumination unit 31 that is configured to illuminate an illuminated region that comprises an entire edge of a substrate. The illumination unit 31 may provide an annular illumination and may be an annular illumination unit.

b. A sensing unit 40 having a field of view that covers the entire edge of the substrate even when the substrate is misaligned. The sensing unit includes sensor 42 that is preceded by a fish eye lens 41. The sensor is configured to generate detection signals of the entire edge of the substrate.

c. Processing circuit 12 that is configured to process the detection signals and determine whether the substrate is misaligned. The determining that the substrate is misaligned triggers an execution of one or more misalignment correction operation for aligning the substrate.

The processing circuit may be implemented as a central processing unit (CPU), and/or one or more other integrated circuits such as application-specific integrated circuits (ASICs), field programmable gate arrays (FPGAs), full-custom integrated circuits, etc., or a combination of such integrated circuits.

According to an embodiment, the substrate alignment system 10 also includes a controller 14 configured to control an execution of the one or more misalignment correction operation for aligning the substrate.

According to an embodiment, the substrate alignment system 10 also includes a memory unit 16. The memory unit may stores instructions to be executed by the processing circuit and/or the controller. The memory unit may store information such as detection signals, misalignment status information regarding the substrate.

Figure 2:
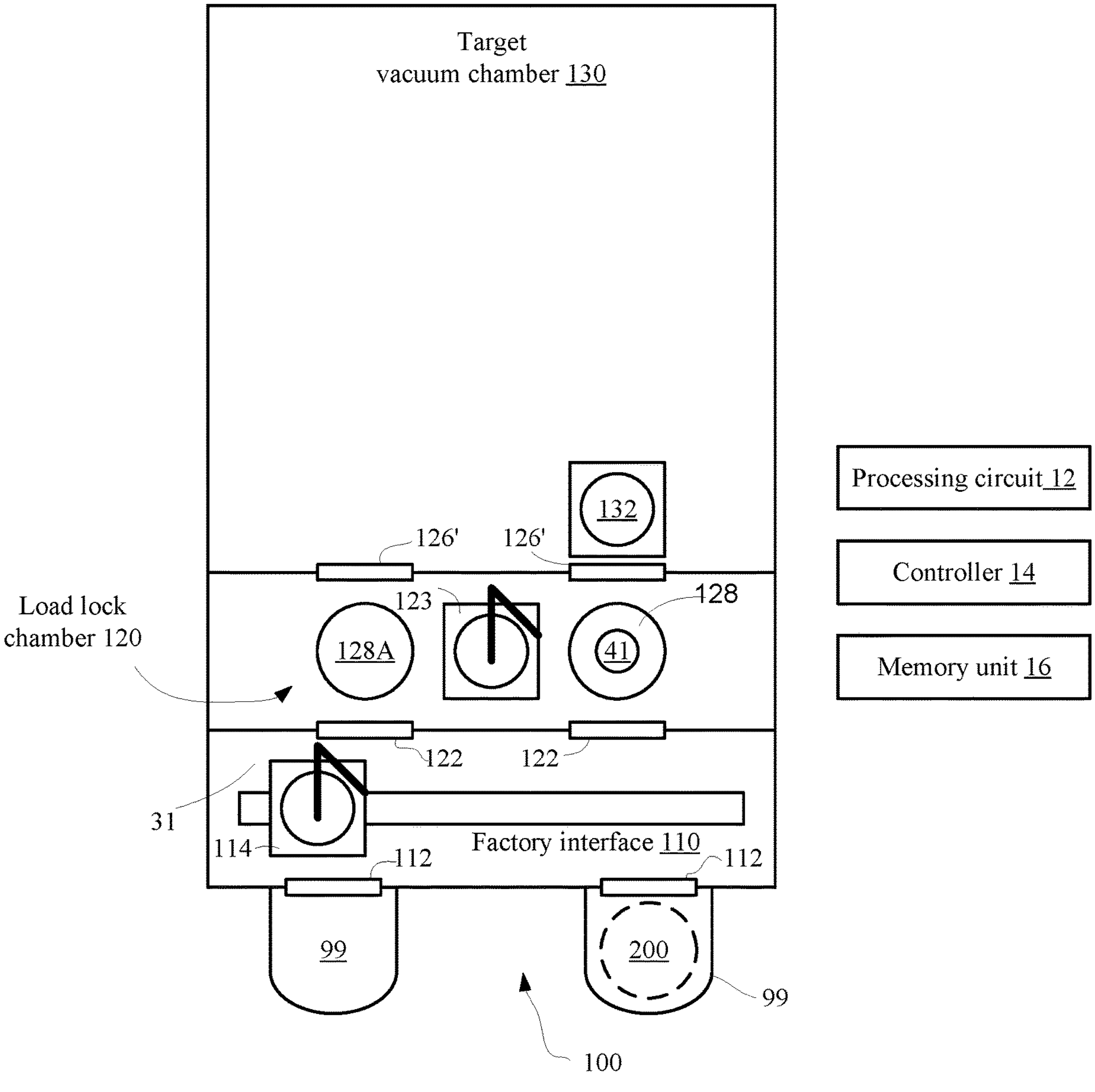
FIG. 2 illustrates an example of a substrate alignment system, and also illustrates a cross section of a substrate evaluation system.

FIG. 2 illustrates an example of a cross section of a substrate evaluation system 100 and also illustrates some units of the substrate alignment system 10.

The substrate evaluation system 100 includes factory interface 110, a load lock chamber 120 and a target vacuum chamber 130. The target vacuum chamber is a destination of the substrate. In FIG. 1 the target vacuum chamber belongs to a substrate evaluation system and is used for evaluating the substrate.

It should be noted that the target vacuum chamber may be a substrate processing chamber in which the substrate is processed, for example manufactured, etched, undergo a deposition process, and the like.

The factory interface 110 can be any suitable enclosure, such as, e.g., an Equipment Front End Module (EFEM).

The factory interface 110 can be configured to receive one or more substrates from substrate carriers 99 (e.g., Front Opening Unified Pods (FOUPs)) docked at various load ports 112 of the factory interface. One of the substrate carriers 99 is illustrated as storing substrate 200.

The factory interface robot 114 is configured to transfer substrates between the substrate carriers 99 and the load lock chamber 120.

According to an embodiment, the load lock chamber 120 includes:

a. A first load lock stage 128.

b. A second load lock stage 128A.

c. A first window (denoted 124 in FIGS. 3 and 4).

d. A second window (denoted 125 in FIGS. 3 and 4).

e. A load lock robot 123 that is configured to transfer the substrate between the load lock chamber and the target vacuum chamber. The load lock robot may transfer the substrate between the target vacuum chamber and the first load lock stage or the second load lock stage.

f. A top (denoted 127 in FIGS. 3 and 4).

g. A bottom (denoted 126 in FIGS. 3 and 4).

h. One or more slit valves and/or doors such as doors 122 configured to open when receiving or releasing substrates to and/or from factory interface robot 114.

i. One or more additional slit valves and/or additional doors such as additional doors 126' that are configured to open when receiving or releasing substrates to and/or from target vacuum chamber 130.

It is assumed, for simplicity of explanation, that the first load lock stage 128 is used during a process of providing a substrate to the target vacuum chamber, and that the second load lock stage 128A is used during a process of providing a substrate to the factory interface. This assumption is an example and any of the load lock stage may be used for transferring a substrate in any direction.

A vacuum environment, a clean environment, and/or a temperature controlled environment may be maintained within the load lock chamber 120 and/or the target vacuum chamber 130.

The target vacuum chamber 130 includes a mechanical stage 132 for supporting the substrate and moving the substrate within the target vacuum chamber 130.

In FIG. 2, the controller 14, the processing circuit 12 and the memory unit are located outside the substrate evaluation system 100.

Figure 3:
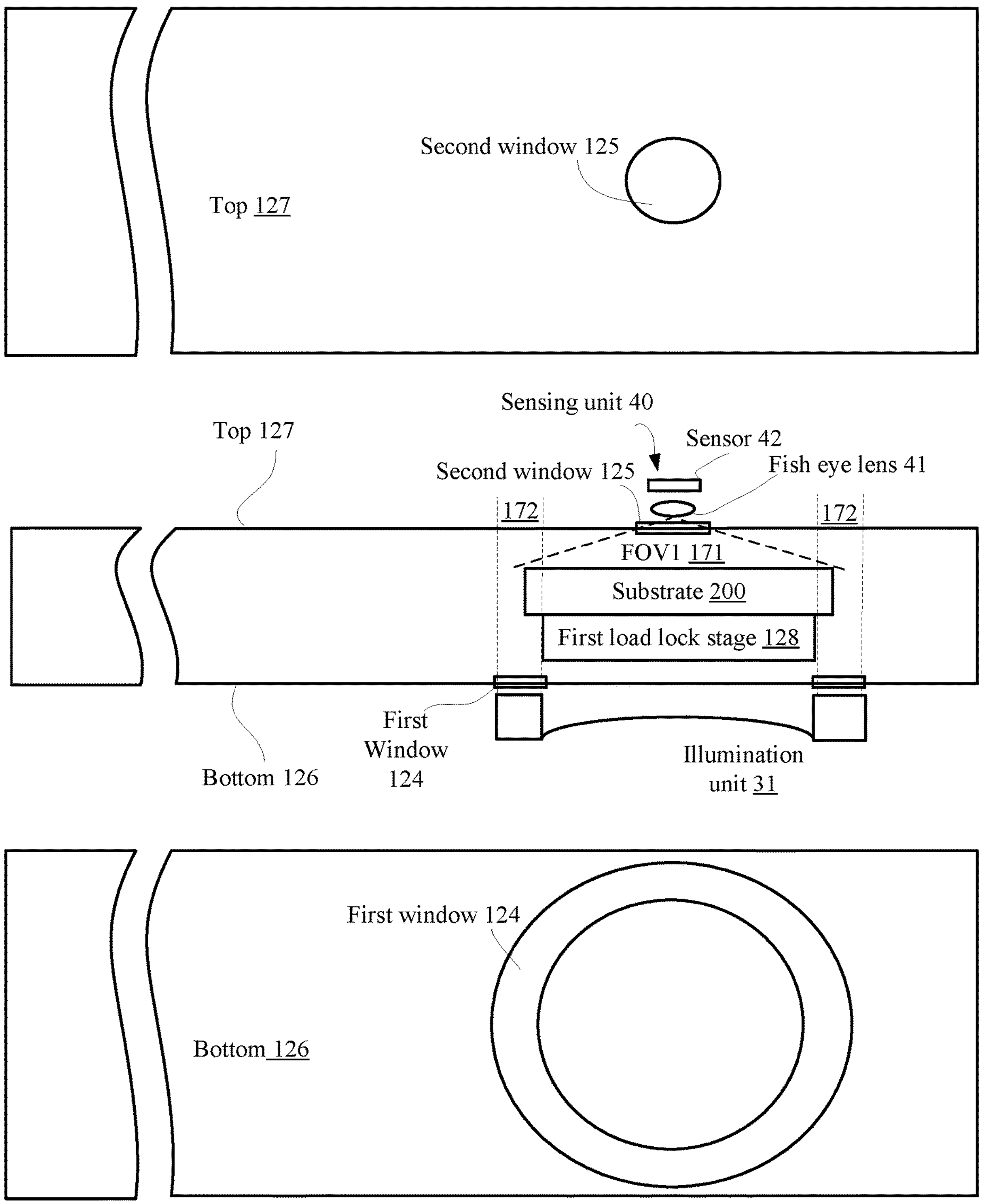
FIG. 3 illustrates an example of a substrate and a substrate alignment system.
Figure 4:
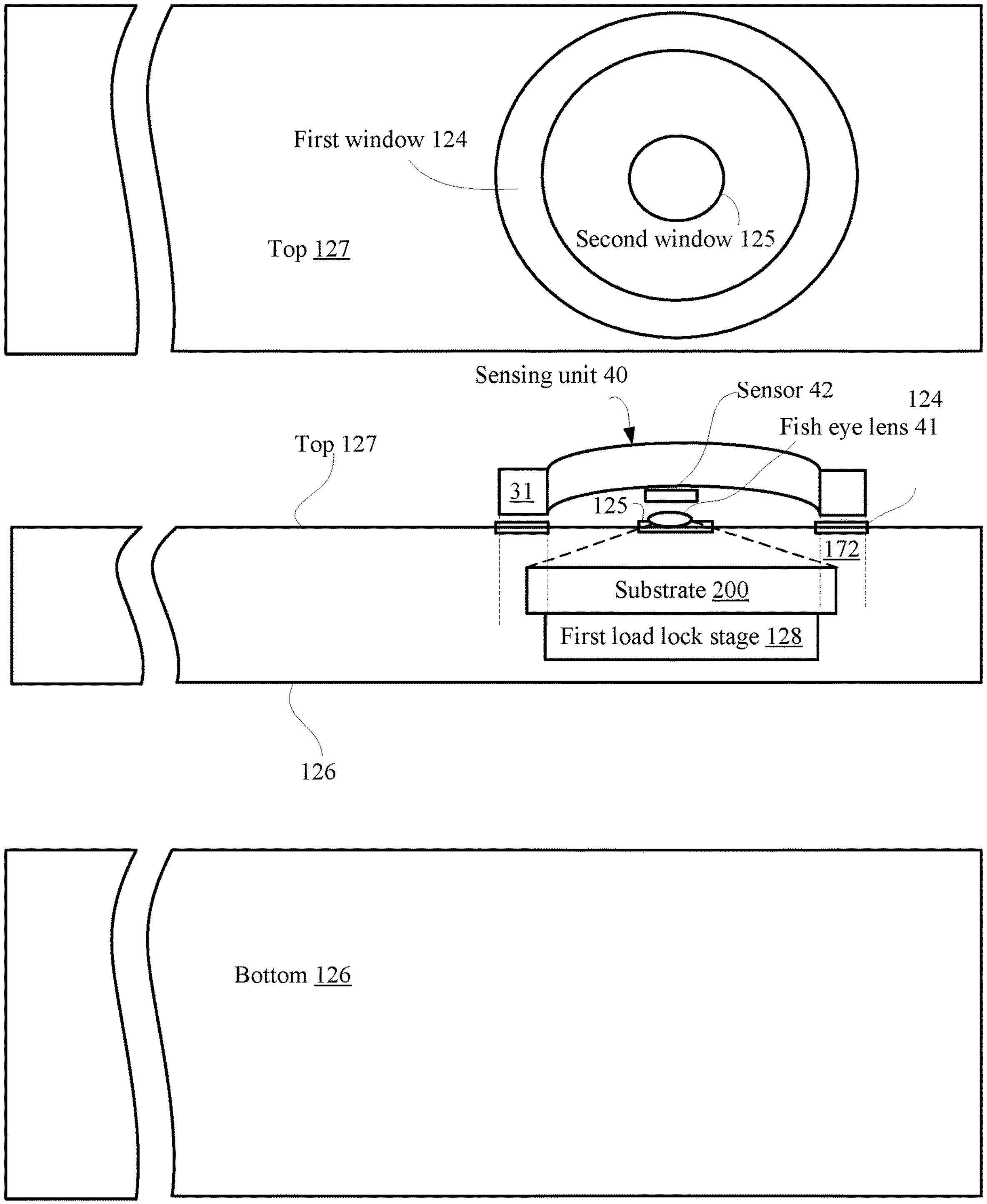
FIG. 4 illustrates an example of a substrate and a substrate alignment system.

FIGS. 3 and 4 illustrates examples of a load lock chamber and some units of the substrate alignment system 10.

In FIG. 3 the illumination unit 31 is located below a bottom 126 of the load lock chamber and directs its illumination (denoted 172) upwards, through the first window 124 that is formed at the bottom 126 of the load lock chamber.

In FIG. 4 the illumination unit 31 is located above a top 127 of the load lock chamber and directs its illumination (denoted 172) downwards, through the first window 124 that is formed at the top 127 of the load lock chamber.

In both FIGS. 3 and 4 the sensing unit 40 is located above the top 127 of the load lock and has a field of view (denoted FOV 171) that covers the entire edge of the substrate, even when the substrate is misaligned. The sensing unit 40 views the entire edge of the substrate through a second window 125 located at the top 127 of the load lock chamber.

In FIGS. 3 and 4 the sensing unit includes fish eye lens 41 that is followed by sensor 42. The sensor may be a two dimensional image sensor that includes an array of sensing elements. The fish eye lens 41 is configured to capture the entire edge of a 300 millimeters when located at a distance of less than 50 mm from the substrate. An example of a fish eye lens is the ADL HFE1414C ½" 1.4 mm (Fish eye) F1.4 Fixed Iris & Manual Focus C-Mount Lens, 5 Megapixel Rated, 185° FOV of RMA Electronics Inc. from Hingham, Massachusetts, USA.

The sensor 42 may be integrated with an image processor, see, for example, the Alvium 1800u of Allied Vision of Stadtroda, Germany.

In both FIGS. 3 and 4 the substrate 200 is supported by load lock stage 128.

According to an embodiment, the load lock stage 128 is configured to perform a misalignment correction operation for aligning the substrate—that involve correcting a rotational error—in which the notch of the substrate is located at a wrong angle.

Figure 5:
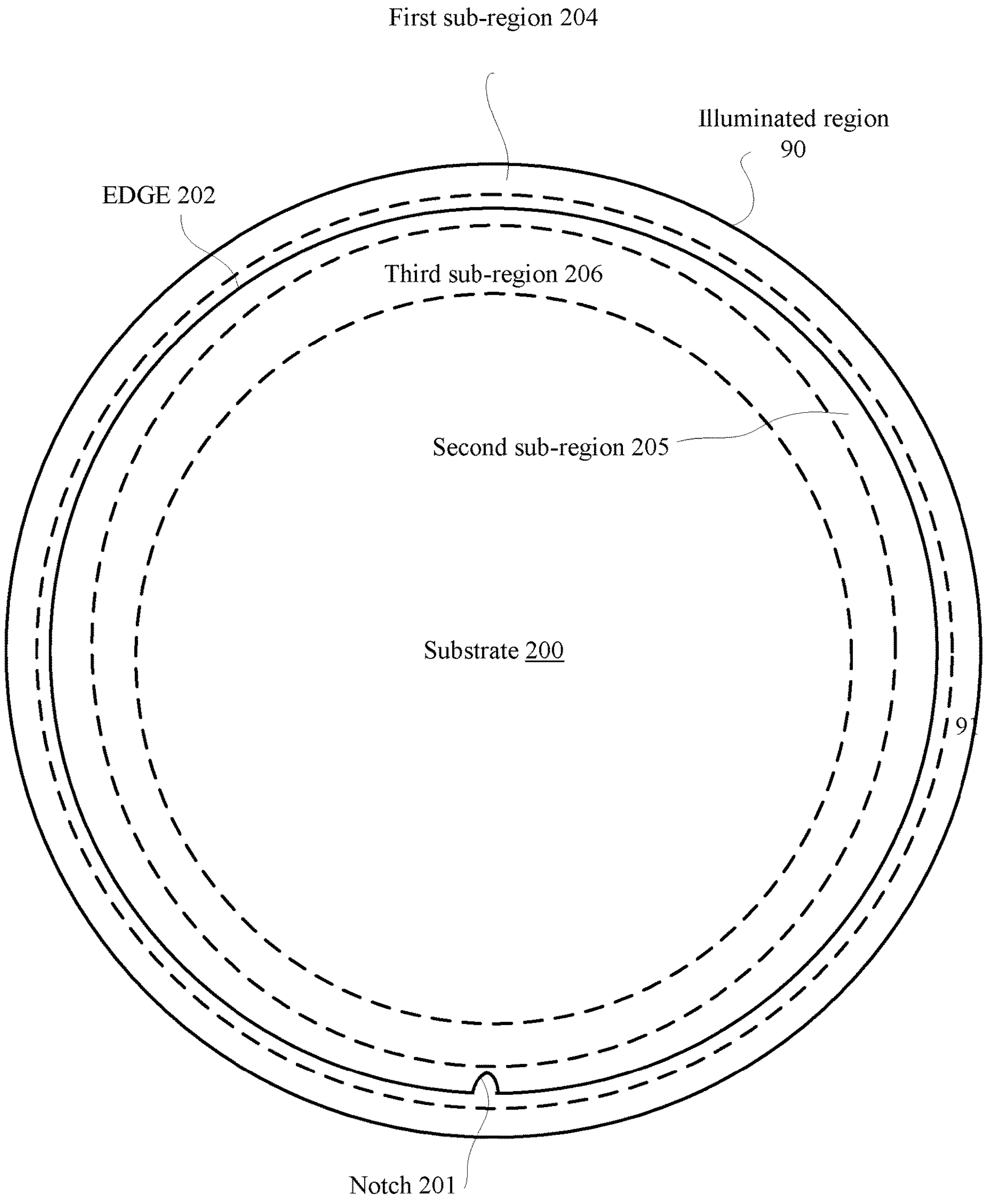
FIG. 5 illustrates an example of a substrate and an illuminated region.

FIG. 5 illustrates an example of substrate 200 and illuminated region 90.

Illuminated region 90 surrounds substrate 200—and the borders of the illuminated region are spaced apart to include the edge 202 of the substrate despite any misalignment of the substrate.

FIG. 5 also illustrates various concentric subregions of an image acquired by the sensing unit. The sub-regions include a first sub-region 204, a second sub-region 205 and a third sub-region 206.

According to an embodiment, the processing circuit is configured to compensate for the distortions introduced by the fish eye lens.

According to an embodiment, the compensation includes mapping pixels of an image acquired by the sensing unit to mapped pixels that reflect the real portions of the substrate that appear in the pixels.

A linear mapping may be applied and includes assigning a first linear distortion coefficient (C1) to the first sub-region 204 of an image of the illuminated region, a second linear distortion coefficient (C2) to the second sub-region 205 of the image of the illuminated region, and a third linear distortion coefficient (C3) to the third sub-region 206 of the image of the illuminated region. There may be any relationship between the values of C1, C2 and C3. For example, C1 may exceed C2, and C2 may exceed C3.

In order to find the misalignment of the wafer, the exact location of the notch 201 is determined.

Assuming that the deepest point of notch 201 appears in a certain pixel of an image captured by the sensor—then the distance between the deepest point to the border of the illumination region may be calculated by a linear approximation, based on the location of the pixel.

Assuming that the deepest point of the notch is within the first sub-region then the linear compensation includes calculating the real distance between the deepest point of the notch and an the edge of the illuminated region by multiplying the distance (in the image) between the deepest point to the edge of the illuminated region by C1.

Assuming that the deepest point of the notch is within the first sub-region then the linear compensation includes calculating the real distance between the deepest point of the notch and an the edge of the illuminated region by (a) multiplying C2 by a distance (in the image) between the deepest point and the border between the first sub-region to the second sub-region, and (b) adding a product of a multiplication between the width of the first sub-region and C1.

Assuming that the deepest point of the notch is within the third sub-region then the linear compensation includes calculating the real distance between the deepest point of the notch and an the edge of the illuminated region by (a) multiplying C3 by a distance (in the image) between the deepest point and the border between the second sub-region to the third sub-region, (b) adding a product of a multiplication between the width of the second sub-region and C2, and (b) adding a product of a multiplication between the width of the first sub-region and C1.

Applying the mentioned above linear approximation on the x-coordinate of the deepest point provides the x-axis misalignment.

Applying the mentioned above linear approximation on the y-coordinate of the deepest point provides the y-axis misalignment.

Figure 6:
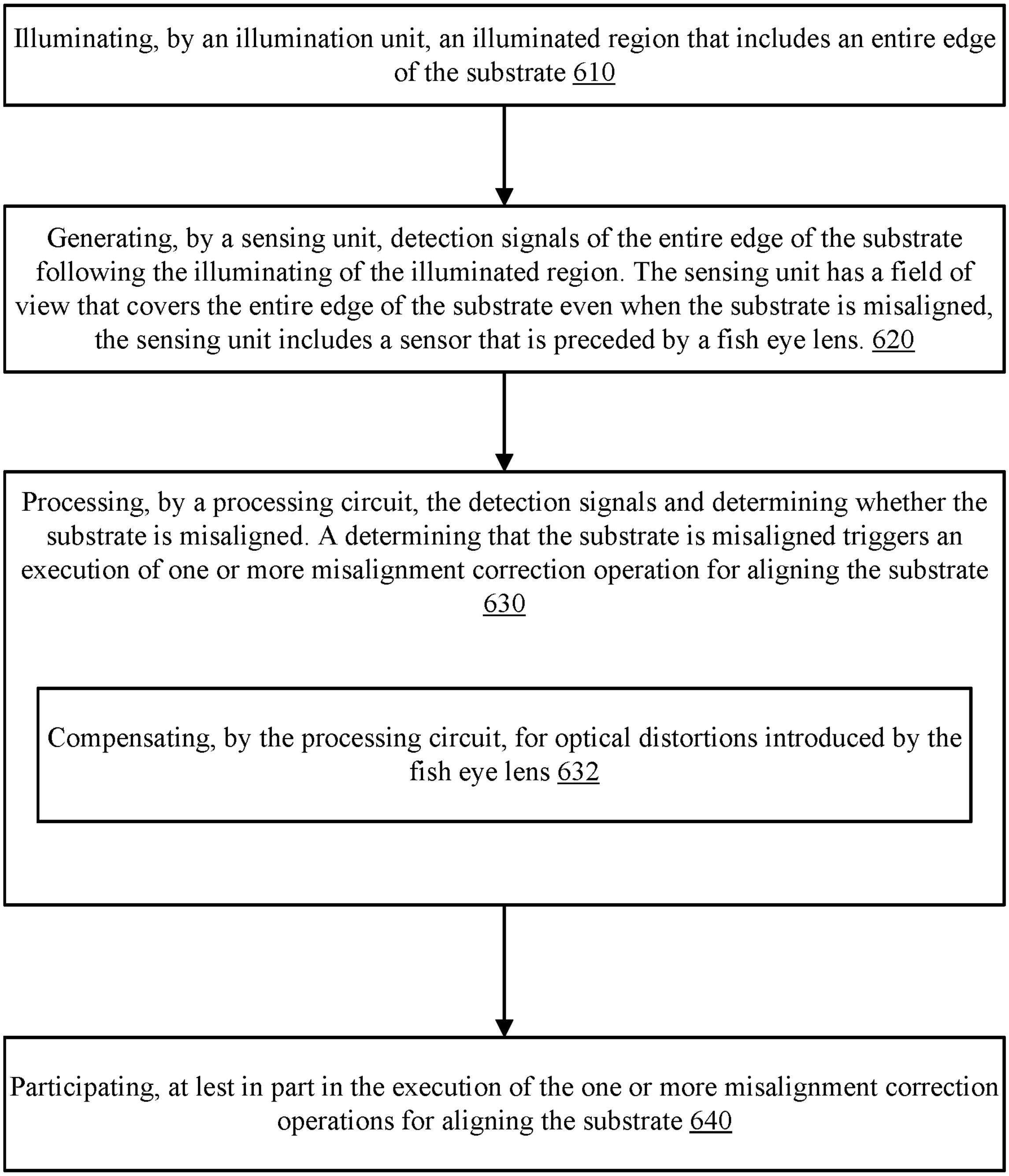
FIG. 6 illustrates an example of a method.

FIG. 6 illustrates an example of method 600 for an alignment of a substrate.

According to an embodiment, method 600 includes step 610 of illuminating, by an illumination unit, an illuminated region that includes an entire edge of the substrate.

According to an embodiment, step 610 is followed by step 620 of generating, by a sensing unit, detection signals of the entire edge of the substrate following the illuminating of the illuminated region. The sensing unit has a field of view that covers the entire edge of the substrate even when the substrate is misaligned, the sensing unit includes a sensor that is preceded by a fish eye lens.

According to an embodiment, step 620 is followed by step 630 of processing, by a processing circuit, the detection signals and determining whether the substrate is misaligned. A determining that the substrate is misaligned triggers an execution of one or more misalignment correction operation for aligning the substrate.

According to an embodiment, step 630 includes step 632 of compensating, by the processing circuit, for optical distortions introduced by the fish eye lens.

According to an embodiment, step 632 includes applying a linear approximation of the optical distortions. The application of the linear approximation may include associating different linear distortion coefficients to different concentric sub-regions of an image of the illuminated region.

According to an embodiment, step 630 is followed by step 640 of participating, at least in part in the execution of the one or more misalignment correction operations for aligning the substrate.

Step 640 may include at least one of:

a. Triggering the execution of the one or more misalignment correction operation.
b. Controlling an execution of the one or more misalignment correction operation.
c. Executing the one or more misalignment correction operation.

According to an embodiment, step 610 and step 620 are executed while the substrate is located within a load lock chamber and the sensing unit and the illumination unit are located outside the load lock chamber.

According to an embodiment, step 610 and step 620 are executed while the load lock chamber undergoes a load lock pressure equalization process. This reduces and even eliminates any impact of the execution of steps 610 and 620 on a throughput of a substrate evaluation system—as the execution of steps 610 and 612 is shorter that the duration of the load lock pressure equalization process.

According to an embodiment, step 610 includes illuminating the illuminated region through a first window formed in the load lock chamber, and step 620 includes acquiring, by the sensing unit an image of the entire edge of the substrate through a second window formed in the load lock chamber.

According to an embodiment a distance between the fish eye lens and the substrate is less than one third of a diameter of the substrate.

According to an embodiment the one or more misalignment correction operations comprise rotating the substrate.

According to an embodiment, the one or more misalignment correction operations includes generating at least one indication about at least one misalignment selected out of a x-axis misalignment and a y-axis misalignment. The at least one indications used by the mechanical stage of the target vacuum chamber to correct the x-axis misalignment and the y-axis misalignment—by receiving the substrate while positioning the mechanical stage at a location that compensates for the x-axis misalignment and the y-axis misalignment.

In the foregoing specification, numerous specific details are set forth in order to provide a thorough understanding of the embodiments of the disclosure.

However, it will be understood by those skilled in the art that the present embodiments of the disclosure may be practiced without these specific details. In other instances, well-known methods, procedures, and components have not been described in detail so as not to obscure the present embodiments of the disclosure.

The subject matter regarded as the embodiments of the disclosure is particularly pointed out and distinctly claimed in the concluding portion of the specification. The embodiments of the disclosure, however, both as to organization and method of operation, together with objects, features, and advantages thereof, may best be understood by reference to the following detailed description when read with the accompanying drawings.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

Because the illustrated embodiments of the disclosure may for the most part, be implemented using electronic components and circuits known to those skilled in the art, details will not be explained in any greater extent than that considered necessary as illustrated above, for the understanding and appreciation of the underlying concepts of the present embodiments of the disclosure and in order not to obfuscate or distract from the teachings of the present embodiments of the disclosure.

Any reference in the specification to a method should be applied mutatis mutandis to a system capable of executing the method and should be applied mutatis mutandis to a non-transitory computer readable medium that stores instructions that once executed result in the execution of the method.

Any reference in the specification to a system should be applied mutatis mutandis to a method that may be executed by the system and should be applied mutatis mutandis to a non-transitory computer readable medium that stores instructions that can be executed by the system.

Any reference in the specification to a non-transitory computer readable medium should be applied mutatis mutandis to a method that may be executed when executing instructions stored in non-transitory computer readable medium and should be applied mutandis to a system that is configured to executing instructions stored in the non-transitory computer readable medium.

The term "and/or" means additionally or alternatively. For example A and/or B means only A, or only B or A and B.

In the foregoing specification, the embodiments of the disclosure have been described with reference to specific examples of embodiments. It will, however, be evident that various modifications and changes may be made therein without departing from the broader spirit and scope of the appended claims.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the disclosure described herein are, for example, capable of operation in other orientations than those illustrated or otherwise described herein.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures may be implemented which achieve the same functionality.

Any reference to the term "comprising" or "having" or "including" should be applied mutatis mutandis to "consisting" and/or should be applied mutatis mutandis to "consisting essentially of".

Any arrangement of components to achieve the same functionality is effectively "associated" such that the desired functionality is achieved. Hence, any two components herein combined to achieve a particular functionality may be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the above described operations are merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also, for example, in one embodiment, the illustrated examples may be implemented as circuitry located on a single integrated circuit or within a same device. Alternatively, the examples may be implemented as any number of separate integrated circuits or separate devices interconnected with each other in a suitable manner.

Also, for example, the examples, or portions thereof, may implemented as soft or code representations of physical circuitry or of logical representations convertible into physical circuitry, such as in a hardware description language of any appropriate type.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to embodiments containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

While certain features of the embodiments have been illustrated and described herein, many modifications, substitutions, changes, and equivalents will now occur to those of ordinary skill in the art. It is, therefore, to be understood that the appended claims are intended to cover all such modifications and changes as fall within the true spirit of the embodiment.

What is claimed is:

1. A substrate alignment system, comprising:

an illumination unit configured to illuminate an illuminated region that comprises an entire edge of a substrate;

a sensing unit having a field of view that covers the entire edge of the substrate even when the substrate is misaligned, the sensing unit comprising a sensor that is preceded by a fish eye lens, the sensor is configured to generate detection signals of the entire edge of the substrate; and a processing circuit configured to process the detection signals and determine whether the substrate is misaligned; wherein a determining that the substrate is misaligned triggers an execution of one or more misalignment correction operations for aligning the substrate;

wherein the processing circuit is configured to compensate for optical distortion introduced by the fish eye lens by applying a linear approximation of the optical distortions, wherein the applying of the linear approximation comprises associating different linear distortion coefficients to different concentric sub-regions of an image acquired by the sensing unit.

2. The substrate alignment system according to claim 1, wherein the illumination unit is configured to illuminate the illuminated region while the substrate is located within a load lock chamber, wherein the sensing unit and the illumination unit are located outside the load lock chamber.

3. The substrate alignment system according to claim 2, wherein the illumination unit is configured to illuminate the illuminated region while the load lock chamber undergoes a load lock pressure equalization process.

4. The substrate alignment system according to claim 2, wherein the illumination unit is configured to illuminate the illuminated region through a first window formed in the load lock chamber and wherein the sensing unit is configured to acquire an image of the entire edge of the substrate through a second window formed in the load lock chamber.

5. The substrate alignment system according to claim 2, wherein a distance between the fish eye lens and the substrate is less than one third of a diameter of the substrate.

6. The substrate alignment system according to claim 1, wherein the one or more misalignment correction operations comprise rotating the substrate.

7. The substrate alignment system according to claim 1, wherein the one or more misalignment correction operations comprise generating at least one indication about at least one misalignment selected out of a x-axis misalignment and a y-axis misalignment.

8. The substrate alignment system according to claim 1 further comprising a controller that is configured to control the one or more misalignment correction operations for aligning the substrate.

9. The substrate alignment system according to claim 1, wherein the processing circuit is configured to identify an indicia along the substrate edge and determine whether the substrate is misaligned based on a location of the indicia.

10. The substrate alignment system according to claim 9 wherein the indicia comprises a notch.

11. A method for an alignment of a substrate, the method comprising:

illuminating, by an illumination unit, an illuminated region that comprises an entire edge of the substrate;

generating, by a sensing unit, detection signals of the entire edge of the substrate following the illuminating of the illuminated region; wherein the sensing unit has a field of view that covers the entire edge of the substrate even when the substrate is misaligned, the sensing unit comprises a sensor that is preceded by a fish eye lens; and processing, by a processing circuit, the detection signals and determining whether the substrate is misaligned; wherein a determining that the substrate is misaligned triggers an execution of one or more misalignment correction operations for aligning the substrate;

further comprising compensating, by the processing circuit, for optical distortions introduced by the fish eye lens by applying a linear approximation of the optical distortions, wherein the applying of the linear approximation comprises associating different linear distortion coefficients to different concentric sub-regions of an image acquired by the sensing unit.

12. The method according to claim 11 further comprising executing the illuminating while the substrate is located within a load lock chamber, wherein the sensing unit and the illumination unit are located outside the load lock chamber.

13. The method according to claim 12 further comprising executing the illuminating while the load lock chamber undergoes a load lock pressure equalization process.

14. The method according to claim 12, wherein the illuminating comprises illuminating the illuminated region through a first window formed in the load lock chamber and wherein the method comprises acquiring, by the sensing unit an image of the entire edge of the substrate through a second window formed in the load lock chamber.

15. The method according to claim 12, wherein a distance between the fish eye lens and the substrate is less than one third of a diameter of the substrate.

16. The method according to claim 11 wherein the one or more misalignment correction operations comprise rotating the substrate.

17. The method according to claim 11, wherein the one or more misalignment correction operations comprise generating at least one indication about at least one misalignment selected out of a x-axis misalignment and a y-axis misalignment.

18. A non-transitory computer readable medium for aligning a substrate, the non-transitory computer readable medium stores instructions that once executed by a substrate alignment system, cause the substrate alignment system to:

illuminate, by an illumination unit of the substrate alignment system, an illuminated region that comprises an entire perimeter of the substrate edge;

generate, by a sensing unit of the substrate alignment system, detection signals of the entire perimeter of the substrate edge following the illuminating of the illuminated region; wherein the sensing unit has a field of view that covers the entire perimeter of the substrate edge, as viewed from a direction normal to a primary surface of the substrate, even when the substrate is misaligned, the sensing unit comprises a sensor that is preceded by a fish eye lens; and process, by a processing circuit of the substrate alignment system, the detection signals and determining whether the substrate is misaligned;

wherein a determining that the substrate is misaligned triggers an execution of one or more misalignment correction operations for aligning the substrate; and wherein the processing circuit is configured to compensate for optical distortion introduced by the fish eye lens by applying a linear approximation of the optical distortions, wherein the applying of the linear approximation comprises associating different linear distortion coefficients to different concentric sub-regions of an image acquired by the sensing unit.

* * * * *